United States Patent

Mersali et al.

Patent Number: 6,025,207
Date of Patent: Feb. 15, 2000

[54] METHOD FOR MANUFACTURE OF A BURIED STRUCTURE LASER DEVICE FOR INTEGRATED PHOTONIC CIRCUIT

[75] Inventors: Boumédienne Mersali, Arcueil; François Dorgeuille, Paris, both of France

[73] Assignee: France Telecom

[21] Appl. No.: 09/073,459

[22] Filed: May 6, 1998

Related U.S. Application Data

[62] Division of application No. 08/670,876, Jun. 28, 1996.

[30] Foreign Application Priority Data

Jul. 6, 1995 [FR] France .................................. 95 08200

[51] Int. Cl.⁷ .................................................. H01L 21/20
[52] U.S. Cl. .............................. 438/29; 438/31; 438/39; 438/46
[58] Field of Search ................................ 438/29, 31, 38, 438/39, 41, 46

[56] References Cited

U.S. PATENT DOCUMENTS

| | | | |
|---|---|---|---|
| 5,070,510 | 12/1991 | Konushi et al. | 372/46 |
| 5,288,659 | 2/1994 | Koch et al. | 437/129 |
| 5,568,499 | 10/1996 | Lear | 372/45 |
| 5,703,895 | 12/1997 | Ghirardi et al. | 372/50 |

*Primary Examiner*—Olik Chaudhuri
*Assistant Examiner*—Douglas A. Wille
*Attorney, Agent, or Firm*—Nilles & Nilles SC

[57] ABSTRACT

A method for the manufacture of a buried structure laser device for integration with an optical guide in a photonic circuit. This method brings about the successive growth, on a buffer layer doped with carriers of a first type and covering the entire surface of a substrate doped with carriers of the same type, a first guiding layer formed by a non-doped quaternary compound, an extremely thin intermediate layer highly doped with carriers of the first type. A second active layer is formed by a non-doped quaternary compound, and a protection layer is doped with carriers of a second type where only the active layer is etched in the form of one or more steps and then buried in a layer of sheathing doped with carriers of the second type.

20 Claims, 5 Drawing Sheets

METHOD FOR MANUFACTURE OF A BURIED STRUCTURE LASER DEVICE FOR INTEGRATED PHOTONIC CIRCUIT

CROSS-REFERENCE TO RELATED APPLICATION

This application is a divisional of U.S. Ser. No. 08/670,876, filed Jun. 28, 1996 and allowed Mar. 6, 1998.

BACKGROUND OF THE INVENTION

1. Field of the Invention

The invention relates to a laser device or double buried heterostructure optical guide amplifier and a simple method for the monolithic integration of this device into complex photonic circuits.

A device of this kind is very useful, especially for the making of complex integrated optical circuits used in integrated optics or optical telecommunications for example.

2. Description of the Prior Art

Up until now, many different approaches have been envisaged for the making of laser devices or buried structure optical amplifiers integrated into photonic circuits. In every case, the manufacturing methods are complex and require several epitaxial operations, namely at least three epitaxial operations and/or specific epitaxial operations such as localized epitaxy for example.

Furthermore, although the performance characteristics of the active components, namely the lasers or amplifiers made according to existing methods, are generally good, those of optical guides are often inadequate, so much so that they dictate a limiting of the size of the integrated optical circuits. Finally, the quality of the coupling between two optical functions varies hugely depending on the methods used.

A recent article, "Taper-waveguide integration for polarization insensitive InP/InGaAsP based optical amplifiers", *Electronics Letters*, Apr. 08, 1994, Vol. 30, No. 16, describes a simple technique for the integration of an amplifier with an optical waveguide designed to facilitate coupling with an optical fiber.

However, this device has a guiding layer with an extremely small thickness in the range of 0.04 micrometers ($\mu$m), enabling a very low confinement factor to be obtained. The device therefore has a deconfined mode enabling it to be coupled to an optical fiber. Furthermore, the optical guide has high optical losses due to the absorption of p type free carriers which are elements for the doping of the InP layers. However, to make integrated photonic circuits, it is necessary to make devices having a highly confined mode and low optical losses. For this reason, the device described in this document cannot be usefully adapted to the making of photonic circuits.

All the currently existing methods, which make use of simple technology, therefore do not enable the making of devices that simultaneously possess high performance values for two different optical functions: there is always a compromise to be made between the performance characteristics of the two integrated optical functions, to the detriment of the quality of the guides. However, there are other methods that can be used to obtain devices with high performance characteristics for two different optical functions. But these methods make use of very complex technologies implementing three to five epitaxial operations so much so that it is quite difficult to obtain the required devices. consequently, the devices manufactured up till now cannot be used to obtain, in a simple way, complex integrated photonic circuits comprising elements such as turns, intersections or Y-shaped connections, for example.

SUMMARY OF THE INVENTION

A first object of the present invention relates to a laser device or double buried heterostructure optical guide amplifier comprising:

a buffer layer doped with carriers of a first type and covering the entire surface of a substrate doped with carriers of the same type, a first layer playing the role of an optical guide formed by a non-doped quaternary compound and covering the entire surface of the buffer layer, an extremely thin intermediate layer, highly doped with carriers of the first type and covering the entire surface of the guiding layer, one or more strips of active layer playing the role of lasers or amplifiers formed by a non-doped quaternary compound, and a sheathing layer doped with carriers of a second type.

This double buried heterostructure laser or DBH has a structure of the same type as that of the standard buried ridge strip laser device (BRS).

The extremely thin and highly doped intermediate layer can be used in particular to obtain a high coupling coefficient between two optical functions and to obtain good blocking P-N lateral junctions that are necessary and sufficient for the injection of current into the laser device. This intermediate layer furthermore makes it possible to protect the guiding layer against the diffusion of p type free carriers during a resumption of epitaxial growth of a sheathing layer in order to bury the active layer strip.

Another object of the present invention relates to a method for the manufacture of a buried structure device of this kind and for the integration of this device with an optical guide in a photonic circuit. This method consists in bringing about the successive growth, on a buffer layer doped with carriers of a first type, itself deposited on an entire surface (100) of a substrate doped with carriers of the same type, of a first guiding layer formed by a non-doped quaternary compound, an extremely thin intermediate layer highly doped with carriers of the first type, a second layer called an active layer formed by a non-doped quaternary compound and a protection layer doped with carriers of a second type, wherein only the active layer is etched in the form of one or more strips and then buried in a layer of sheathing doped with carriers of the second type.

The fact of etching only the active layer makes it possible to obtain a thick guiding layer beneath this active layer. This guiding layer therefore has a high confinement factor. A single heterostructure waveguide, for example, the core of which is formed by a quaternary material made of InGaAsP, with a gap width equal, in terms of wavelength, to 1.3 $\mu$m must have a thickness that is necessarily greater than 0.3 $\mu$m in order to provide for the propagation of light.

The fact of introducing an intermediate layer between the two layers having different optical functions and the fact of etching only the active layer enables the use of thick layers for each of the optical functions and, therefore, makes it possible to obtain efficient performance characteristics simultaneously for both optical functions. consequently, the laser device according to the invention can validly be applied to the making of complex integrated optical circuits.

BRIEF DESCRIPTION OF THE DRAWINGS

Other features and advantages of the invention shall appear from the following description given by way of an illustrative and non-restrictive example, with reference to the appended figures, of which.

MORE DETAILED DESCRIPTION

Figure 1:
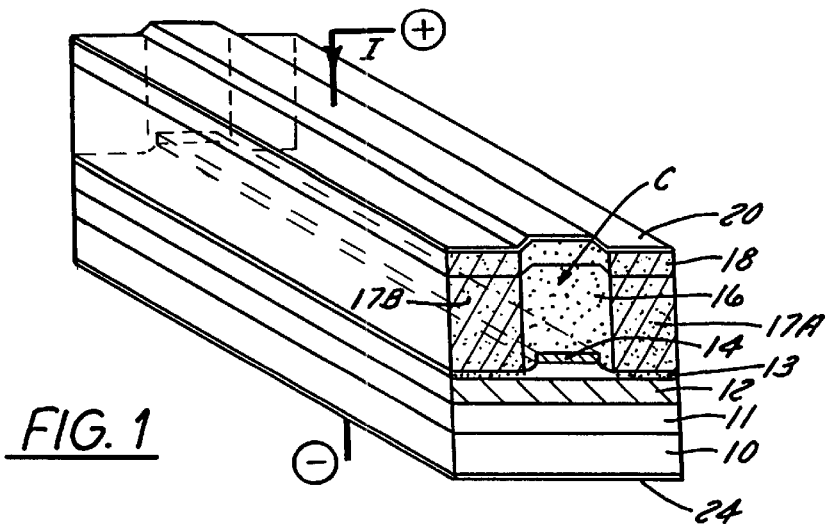
FIG. 1 is a drawing of a device according to the invention.

An embodiment of a device according to the invention shall be understood more clearly with reference to FIG. 1 which shows a schematic view of its structure.

This device has a first layer called a guiding layer 12 and a second layer called an active layer 14 having an optical function different from the first layer since it fulfils the role of an amplifier. These two layers, which have two different optical functions, are both formed by a non-doped quaternary compound and are separated by an extremely thin intermediate layer 13 that is highly doped with n type carriers.

Furthermore, the active layer 14 is etched in the form of one or more strips and is buried in a sheathing layer 16 doped with p type carriers. This sheathing layer is covered with a conductive layer 18 doped with p type carriers. Finally, contacts 20 are made by metallization according to a method well known to those skilled in the art.

According to an alternative embodiment illustrated in FIG. 1, other contacts 24 are made on the lower face of the device in order to enable the application of an operating voltage to the terminals 20, 24 of the device.

The device is made by chemical vapor deposition in only two steps. The layers are successively deposited on a buffer layer 11, doped with n type carriers, itself deposited on an n doped substrate 10. The guiding layer 12 and active layer 14 are stacked in one and the same epitaxial operation and a resumption of epitaxial growth is used to bury the active layer 14 in the sheathing layer 16. This method of manufacture is described in greater detail hereinafter.

The intermediate layer 13 has several functions that all contribute to the efficient operation of the device. A first function is used to obtain blocking P-N lateral junctions that are necessary and sufficient to inject current into the amplifier layer strip 14.

These blocking lateral junctions are P-N type junctions and are formed at the interface between the resumed epitaxial growth of the sheathing layer 16 and the very thin intermediate layer 13 or else beneath this interface. The sheathing layer and the intermediate layer are preferably made of indium phosphide (InP).

Other junctions, known as non-blocking junctions, which are of the P-I-N type, are formed between the sheathing layer 16 of p doped InP, the non-doped active layer 14 and the n doped intermediate layer 13. Consequently, the current I is confined in the strip or strips of the active layer 14 by means of blocking P-N lateral homojunctions contained in the heterostructure.

A second function of the intermediate layer 13 is used to protect the guiding layer 12 against a possible diffusion of zinc which is a doping element for the sheathing layer 16. This protection against the diffusion of zinc thus prevents the formation of optical losses due to the absorption of free carriers in the guiding layer 12.

Furthermore, the intermediate layer 13 plays a major role in the working of the device. Its thickness and its doping have to be optimized to obtain efficient coupling between the guide and the active function, good blocking junctions and very low optical losses.

The thickness must therefore be as low as possible to provide for efficient coupling between two different optical functions. By contrast, it must be as great as possible to have high quality blocking P-N junctions. There is therefore a compromise over the thickness of the intermediate layer. Furthermore, the minimum value of the thickness is also limited by the technology used to manufacture the device. The thickness is consequently between 0.01 and 0.1 $\mu$m and preferably between 0.01 and 0.05 $\mu$m.

The doping must be the maximum to foster the quality of the P-N blocking junctions and limit the diffusion of zinc in the guiding layer 12. Consequently, the concentration in n type carriers in this layer is preferably from $2 \times 10^{17}$ to $2 \times 10^{18}$ cm$^{-3}$. The coupling between the guide and the active function is then evanescent and vertical. Advantageously, this coupling may be improved by the use of an adiabatic transition also known as a mode adapter between the two optical functions.

The material chosen to make this intermediate layer is preferably a binary material such as InP for example, which possesses a crystalline structure similar to that of the active layer 14 or the guiding layer 12.

Furthermore, a layer of InP binary material of this kind appreciably facilitates the resumption of epitaxy of the sheathing layer 16 as compared with a layer made, for example, of a quaternary material.

Advantageously, the guiding layer 12 is thick and can be used to make a single heterostructure type of optical waveguide with low optical losses, namely with a high confinement factor, hence perfectly suited to the making of integrated photonic circuits. This guide is obtained simply by means of a buried active structure comprising a demarcated strip of active layer 14, by etching a part of the guiding layer. This is explained in greater detail hereinafter.

Furthermore, this guiding layer 12 is preferably formed by a non-doped quaternary compound such as $Ga_xIn_{1-x}As_yP_{1-y}$ for example, with x and y possibly varying from 0 to 1. The composition of this layer is advantageously chosen so that the gap width is equal in terms of wavelength to 1.3 $\mu$m and transparent to the operating wavelengths which range from 1.45 to 1.75 $\mu$m.

Advantageously, the guiding layer 12 located beneath the active layer 14 is not etched. Only the active layer, with a thickness of less than 0.6 $\mu$m, is etched in the form of one or more strips so as to improve the directivity of the laser emission and reduce the operating threshold current of the laser device. In the example of FIG. 1, a single strip of active layer 14 is etched. For this reason, the etching whose depth does not exceed 0.6 $\mu$m no longer dictates a limiting of the sum of the thicknesses of the guiding and active layers but only a limiting of the thickness of the active layer 14 which does not exceed 0.6 $\mu$m. Consequently, the guiding layer 12 located beneath the active layer 14 may have a relatively big thickness without the working of the laser being disturbed. Thus, in the case of the single heterostructure guide referred to here above, the thickness of the guiding layer advantageously ranges from 0.3 μm to 1 μm. Generally, the thickness of the guiding layer is less than 1 μm whatever the guide that is made. Furthermore, owing to the size of the thickness of this layer, the confinement factor is high.

Furthermore, the active layer 14 is preferably formed by a non-doped quaternary compound such as $Ga_xIn_{1-x}As_yP_{1-y}$ for example, with x and y ranging from 0 to 1. The composition of this layer is advantageously chosen so that it emits a operating wavelength λg ranging from 1.45 μm to 1.75 μm. Furthermore, the active layer 14 can equally well be made of a bulk material or be based on a quantum well structure.

The conductive layer 18 doped with p type carriers and covering the sheathing layer 16 is advantageously made of InGaAs ternary material.

The lateral regions 17A and 17B of the conductive layer 18, the sheath 16 and the intermediate layer 13 are preferably proton implanted.

Indeed, the proton implantation in these two regions 17A and 17B enables the partial destruction of the crystalline structure of these layers 18, 16, 13 in order to greatly increase their resistivity and thus reduce the section of a C channel in which the current I flows. Consequently, this implantation of protons enables the confinement of the current in the active layer 14 to be increased.

The device that has just been described has two layers having different optical functions. This is only an example and it is quite possible, in an alternative embodiment, to obtain a device with more than two distinct optical functions such as, for example, an optical device in which an amplifier, a photodiode, an optical guide and a modulator are integrated.

Figure 2A:
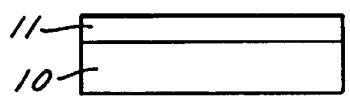
FIGS. 2A to 2G show a sectional view of the device of FIG. 1 during the different steps of a method of manufacture according to the invention.

An exemplary implementation of a method of manufacture of a device of this kind is illustrated in FIGS. 2A to 2G. In a first stage, a flat substrate 10 as shown in FIG. 2A is planned. This substrate is preferably made of indium phosphide doped with n type carriers. A buffer layer 11, also doped with n type carriers, is deposited by gas phase epitaxy throughout the surface (100) of the substrate. This buffer layer 11 is also made of indium phosphide. It makes it possible to facilitate the growth of the other layers made by epitaxy because it has very few defects. This buffer layer 11 is not indispensable. However, it may become necessary when the substrate has many defects in order to restore the homogeneity of the InP material doped with n type carriers.

Several successive layers are then deposited in a single step on the buffer layer 11 by means of a well-known technique of vapor phase epitaxy also known as CVD or chemical vapor deposition. The thickness of the buffer layer is advantageously 0.5 μm to 0.7 μm. Indeed, below 0.5 μm, the thickness is far too small, so much so that the buffer layer is not of very good quality. By contrast, when the thickness exceeds 0.7 μm, the quality of this layer is at its maximum and can no longer be improved. In the example of FIG. 2, the thickness of the buffer layer 11 is preferably equal to 0.6 μm.

Figure 2B:
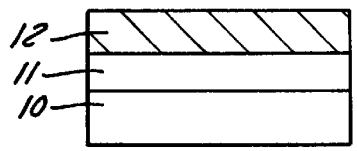

A first layer 12 of a non-doped quaternary compound is then deposited on the buffer layer as shown in FIG. 2B. This layer 12 plays the role of an optical guide. It is preferably made of $Ga_xIn_{1-x}As_yP_{1-y}$, with x and y ranging from 0 to 1 and the composition of this quaternary compound is adapted so that the width of the gap is equal, in terms of wavelength, to 1.3 μm. Advantageously, this guiding layer 12 is deposited on a relatively high thickness, namely on a thickness smaller than 1 μm. In the example of FIG. 2, this thickness is equal to 0.65 μm. Consequently, the guiding layer 12 thus made has a very high factor of confinement and very low optical losses.

Figure 2F:
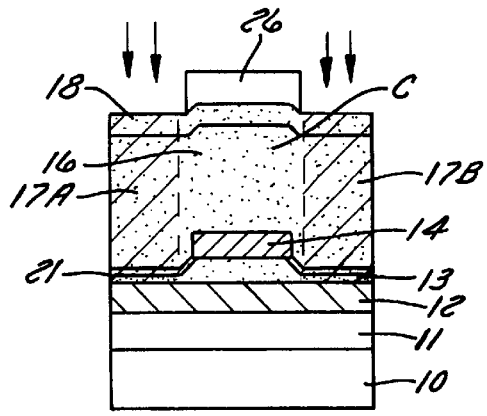
Figure 2C:
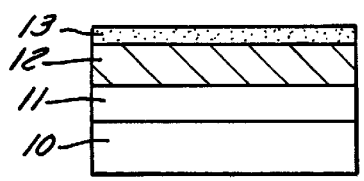

An intermediate layer 13 is then deposited on this first layer so as to separate it from a second layer having a different optical function. This intermediate layer is necessary since it can be used to obtain blocking P-N lateral junctions described hereinafter. It is extremely thin and very highly doped with n type carriers. Indeed, as described here above, the thickness and the doping play a very major role in the quality of the blocking junctions but also in the optical losses and the quality of the coupling between two different optical functions. In the example of FIG. 2C, this layer preferably has a thickness of 0.05 μm and a doping equal to $2 \times 10^{18}$ $cm^{-3}$ in terms of n type carriers.

Figure 2D:
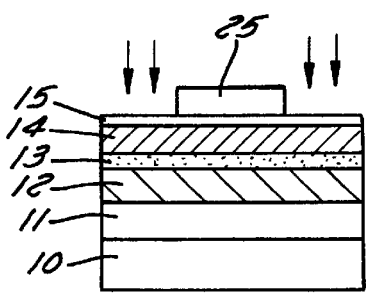

Finally, a second layer, called an active layer 14, of a non-doped quaternary compound is deposited on the intermediate layer 13 and is covered with a thin p doped layer 15. This is shown in FIG. 2D. The second layer 14 plays the role of an optical amplifier. It is preferably made of $Ga_xIn_{1-x}As_yP_{1-y}$, with x and y ranging from 0 to 1 and the composition of this quaternary compound is advantageously adapted so that the gap width is approximately equal to 1.6 μm and so that the amplifier emits at an operating wavelength λg equal to 1.55 μm for example. Furthermore, the sum of the thicknesses of the layers 15 and the amplifier 14 is preferably lower than 0.6 μm.

The p doped layer 15 is advantageously made of indium phosphide and has a very fine thickness such as 0.025 μm for example. This layer 15 of p doped InP makes it possible in particular to facilitate the resumption of epitaxy during the depositing of the sheathing layer 16 enabling the burial of the strip or strips of active layer 14.

The two layers 12 and 14, having different optical functions are therefore stacked on either side of the intermediate layer 13 in a single step. A second step then consists in resuming the chemical vapor deposition to bury the active layer 14.

However, before carrying out a resumption of epitaxy, the active layer 14, and this layer alone, is etched in the form of one or more strips. In the example of FIG. 2E, a single strip of active layer 14 is etched. For this purpose, a mask 25 is placed on the active layer. This mask has a width defining the width of the strip of active layer to be etched. The etching is then done by any dry etching method.

The etching is furthermore controlled on the spot by means of an interferometer used to obtain very precise etching depths and very high reproducibility. The dry etching method is then followed by a light chemical etching in a wet medium enabling the surface regeneration of the material.

The depth of the etching is preferably smaller than 0.6 μm. This depth makes it possible however to etch both the protection layer 15 of p doped InP, the active layer 14 and possibly a part of the intermediate layer 13 of n doped InP. The device obtained following this etching is shown schematically in FIG. 2E.

Furthermore, the strip or strips of active layer 14 thus etched are advantageously oriented along the crystallographic direction {0112}, that enables the best performance characteristics to be obtained for the buried active structures.

The mask 25 is then removed. A second vapor phase epitaxy or chemical vapor deposition is then made in order to bury the strip of active layer 14 of GaInAsP in a sheathing layer 16 as illustrated in FIG. 2F. The resumption of epitaxy is done both on the intermediate layer of InP 13 and on the protection layer of InP 15 that remains on the strip of active layer.

The resumption of epitaxy is therefore easily made since these two layers are made of a binary material. The sheathing layer 16 is also made of indium phosphide (InP) doped with p type carriers in order to preserve the same crystalline structure as the InP layers 13 and 15. The thickness of the sheathing layer is for example 1.8 μm and the concentration in p type carriers is great since it preferably ranges from $2 \times 10^{17}$ and $2.10^{18}$ cm$^{-3}$. In the example of FIG. 2, the doping with p type carriers is equal to $2.10^{18}$ cm$^{-3}$. The sheathing layer is then covered with a non-blocking layer 18 of GaInAs doped with p type carriers.

At this stage of manufacture, a photo-resistant mask 26 is placed on the conductive layer 18 and in the region located above the strip of active layer 14. The mask has a width of 4 to 7 μm, preferably 6 μm. An implantation in depth of protons is then done on either side of the mask 26, in the conductive layer 18, the sheathing layer 16 and the intermediate layer 13 so as to go beyond the blocking P-N lateral junctions. The implantation of protons indeed enables the partial destruction of the crystalline structure of the InGaAs conductive layer 18, the InP sheathing layer 16 and the InP intermediate layer 13 to increase their resistivity. Owing to this implantation of protons, two regions 17A and 17B with high resistivity are created in the conductive layer 18, the sheathing layer 16 and the intermediate layer 13. These two regions are located on either side of a channel C made of InP and InGaAs, doped with p type carriers, and InP, doped with n type carriers, not implanted with protons. It is by this channel C that the current I may flow. The fact of implanting photons therefore makes it possible to reduce the section of the channel C in which the current I flows and to thus increases the confinement of the current in this strip of active layer 14.

Figure 2G:
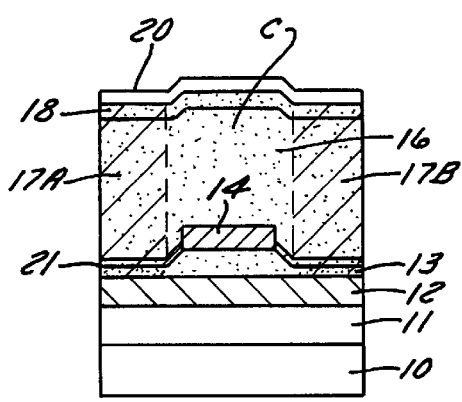
Figure 2E:
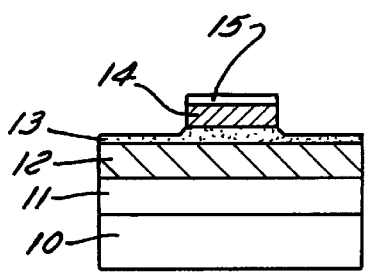

Finally, in a last step of the method, the mask 26 is removed and the Pt/Ti/Au contact zones 20 are deposited on the layer 18 of InGaAs as shown schematically in FIG. 2G.

The extremely thin intermediate layer 13, which is highly doped with n type carriers, can be used to obtain P-N InP/InP blocking lateral junctions 21 shown in dashes in FIGS. 2F and 2G, formed at the interface between the resumption of epitaxy p-InP of the sheathing layer 16 and the intermediate layer 13 or else beneath this interface.

The buried double heterostructure laser device made according to the present invention has a structure similar to the standard buried ridge strip (BRS) device. Indeed, the confinement of the current in the active part is achieved by a built-in potential difference between the central P-I-N diodes or junctions and the lateral P-N diodes or junctions. The difference with the standard BRS device lies in the fact that the lateral P-N junctions are formed at the interface between the resumption of epitaxy and the very thin intermediate layer of n doped InP and not at the interface between the resumption of epitaxy and the buffer layer 11 of n doped InP. However, the type of standard BRS device does not have the guiding layer or the intermediate layer. The characteristics of these two devices were therefore compared.

In the standard InP/InP homostructure BRS laser device, the confinement of the current in the active layer is produced by a wide built-in potential difference between the InP/InP buffer layer P-N lateral homojunctions and the InP/GaInAsP/InP buffer layer P-I-N central heterojunction.

The progress of the current density in these two types of junction has therefore been examined as a function of the voltage applied to the terminals of the device. There is an operating limit voltage for which the leakage of current density reaches the current density injected into the active strip so much so that the confinement of the current disappears very swiftly.

This progress of the current density in two types of junction has also been examined in the DBH laser device according to the invention as a function of the voltage applied to its terminals. The InP/quaternary heterostructure laser device according to the invention has InP/InP intermediate layer P-N blocking lateral junctions and InP/GaInAsP/InP intermediate layer P-I-N non-blocking junctions.

When the InP intermediate layer 13 is not doped, the built-in potentials are practically identical in both types of junction so much so that the confinement of the current is practically inexistent.

By contrast, the progress of the current density in the two types of junctions has been studied also as a function of the thickness and the doping of the intermediate layer. It has been observed that the results are similar either by using a thickness equal to 0.05 μm and an n doping greater than $2 \times 10^{17}$ cm$^{-3}$ or a thicknesses greater than 0.01 μm and a doping equal to $2 \times 10^{18}$ cm$^{-3}$. Furthermore although, in the heterostructure device according to the invention, the nature of the blocking junctions or diodes is different from that of the junctions of the standard homostructure BRS device, the confinement of the current and the levels of operating voltage are similar to the characteristics obtained in the standard BRS device. The device made according to the present invention therefore makes it possible to obtain very excellent laser diode performance characteristics. It is more adaptable to complex integrated optical circuits and it is made according to a very simple method of manufacture using a single resumption of epitaxy.

Figure 3:
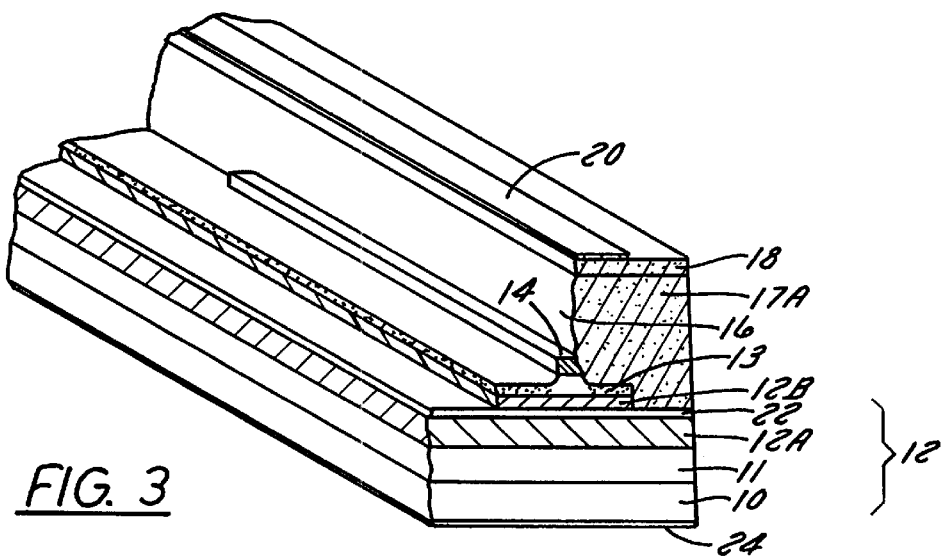
FIG. 3 shows a view of the interior of another device according to the invention.

FIG. 3 illustrates another embodiment of a device according to the invention from which it is possible to manufacture an integrated photonic circuit. This device has a structure similar to that of FIG. 1. This structure indeed has a stack of layers comprising: a guiding layer 12 formed by a non-doped quaternary compound such as GaInAsP, an extremely thin intermediate layer 13 of InP highly doped with n type carriers, an active layer 14 formed by a non-doped quaternary compound such as GaInAsP etched in the form of one or more strips, a sheathing layer 16 of InP doped with p type carriers, a conductive layer 18 of InGaAs and contacts 20. The thicknesses of all these layers are identical or close to those of the device of FIG. 1. Furthermore, in this example, a single strip of active layer is etched along a predetermined length and width.

This embodiment consists of the insertion, in the guiding layer 12, of a second extremely thin intermediate layer 22 highly doped with n type carriers. Thus, the guiding layer 12 has a first guiding zone 12A formed by a quaternary compound not doped with GaInAsP, an extremely thin intermediate layer 22 highly doped with n type carriers and a second guiding zone 12B formed by a quaternary compound not doped with GaInAsP.

Advantageously, the intermediate layer 22 is made out of a binary material such as InP for example and its thickness ranges from 0.01 to 0.1 μm. In the example of FIG. 3, this intermediate layer 22 has a thickness of 0.05 μm. Furthermore, the concentration in n type carriers in this layer ranges from $2 \times 10^{17}$ to $2 \times 10^{18}$ cm$^{-3}$.

This structure of the guiding layer 12 can be used to obtain any integrated photonic circuit. Indeed, the guiding layer 12 too may then be partially etched in order to ensure the charge of the guide, namely the lateral confinement of light in the guide. During the etching of the guide, a part of the second guiding zone 12B is therefore removed.

This etching is done by a dry and/or wet etching method just after the etching of the active layer 14 in the form of one or more strips. Since the intermediate layer 22 is made out of a binary material of InP, it makes it easier to facilitate the resumption of epitaxy of the sheathing layer 16 made of p doped InP. The thickness of the second guiding zone 12B is smaller than that of the first guiding zone 12A and corresponds to the depth of the etching of the guide. In the example of FIG. 3, the thickness of the first zone 12A is equal to 0.5 μm, that of the intermediate layer 22 is equal to 0.05 μm while that of the second guiding zone 12B is equal to 0.1 μm. In this case, the depth of the etching is therefore 0.1 μm.

Figure 4:
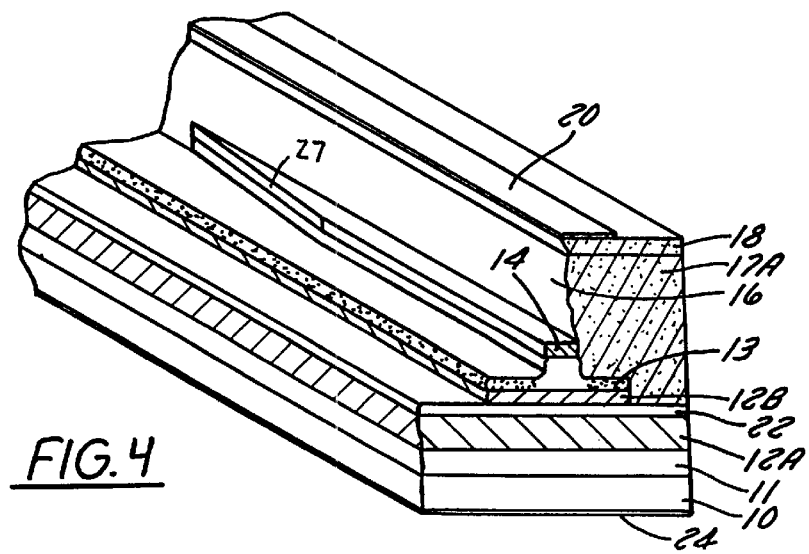
FIG. 4 shows a view of the interior of another device according to an alternative embodiment.

The coupling between the two optical functions is evanescent and vertical. According to an alternative embodiment shown in FIG. 4, this coupling may furthermore be assisted by an adiabatic transition, namely by means of a mode adapter 27, between two optical functions. In the case of the structure according to the invention, this mode adapter can be made simply, advantageously by etching the ends of the active layer strip in the form of a pointed feature.

An example of the performance of a method for the manufacture of a photonic circuit from a device of this kind is illustrated in FIGS. 5A to 5D.

Figure 5A:
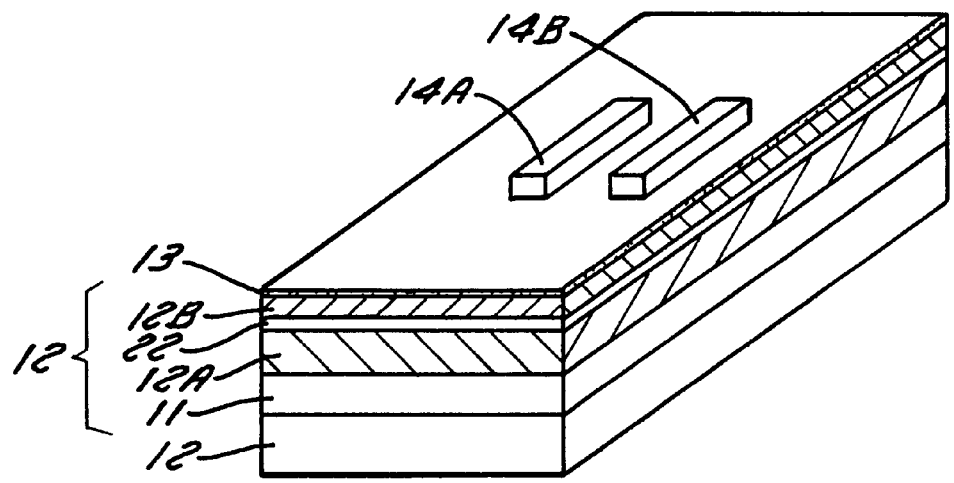
FIGS. 5A to 5D show different steps in the manufacture of an integrated photonic circuit from the device of FIG. 3.

In a first stage, the guiding layer 12, the active layer 14, and the intermediate layers 13 and 22 are made epitaxially in a single step on the buffer layer 11 of n doped InP, which is itself deposited on the substrate 10 of n doped InP, in the same way as in the above example shown in FIGS. 2A to 2G. Furthermore, the active layer 14 is etched in the form of strips 14A and 14B having a specified length and width. This is shown in FIG. 5A. The etching of the active layer is done by means of a dry etching and/or wet etching process, in the same way as in the case of the foregoing example shown in FIGS. 2A to 2G.

Figure 5B:
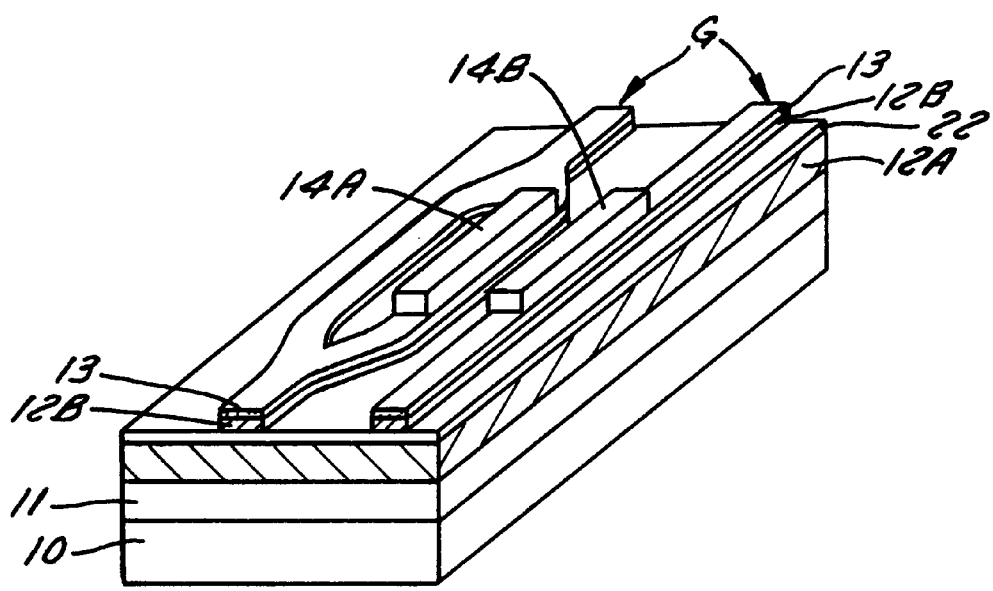

In a second stage, as shown in FIG. 5B, the guiding layer 12B is etched in order to create the charge of the guides G, namely the lateral confinement of the light in the guide. The etching of this layer is also achieved by means of a dry and/or wet etching method. To carry out this etching, masks having a width greater than that of the strips 14A and 14B are placed and centered above each of these amplifier strips. The masks have a great length so as to cover the entire length of the device and a shape appropriate to the photonic circuit that is to be made so that the guides G trace for example Y-shaped connections or turns. The second guiding layer 12B of the waveguide is then removed on either side of these masks.

Figure 5C:
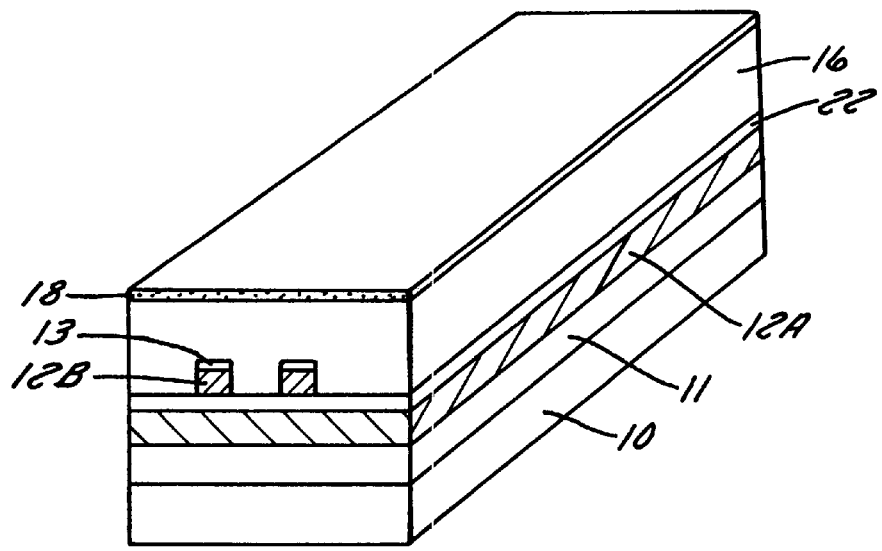

The masks are then withdrawn and a resumption of epitaxial growth is carried out in order to bury the amplifier strips 14A and 14B and the waveguides G in a sheathing layer 16 of p doped InP as shown in FIG. 5C. The device obtained in this step corresponds to the device described here above, illustrated by FIG. 3, which has only one active layer strip.

A subsequent step of this method then consists in uncovering only the guide parts G of the sheathing layer 16 and in leaving the amplifier strips 14A, 14B buried in the sheathing layer. The uncovering is done also by means of a mask placed above the zone in which there are the active strips 14A and 14B. The fact of uncovering the guide parts thus makes it possible to avoid having high optical losses during the operation of the integrated photonic circuit due to the absorption of the p type free carriers of the sheathing layer 16 by the guides. The guides G thus made are of the single heterostructure type.

In an alternative embodiment, it is possible however to make double heterostructure type guides with low losses.

This variant consists in removing the resumed p doped epitaxial layer in the passive part of the manufactured photonic circuit and in making a second non-doped epitaxial layer. However, this type of guide substantially complicates the method of manufacturing the device according to the invention.

Figure 5D:
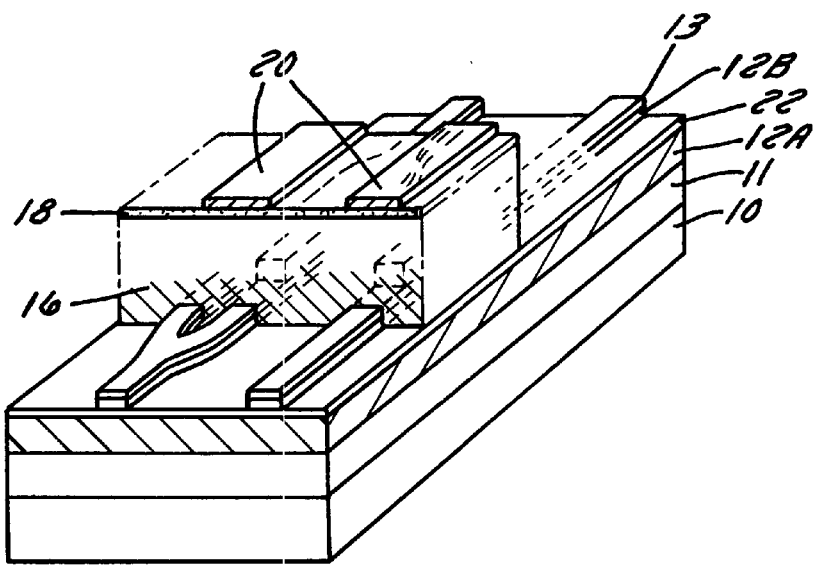

A last step consists in making metallizations 20 of the Pt/Ti/Au type above each active ribbon 14A, 14B in order to create contacts. These metallizations are made by means of methods well known to those skilled in the art. The photonic circuit finally obtained is shown in FIG. 5D.

The method of manufacture of an integrated photonic circuit that has just been described is naturally an example: it may indeed be extended to other types of integration such as the integration of a photodiode, or a modulator, or more complex forms of integration comprising more than two different optical functions for example. These different optical functions are either made in the same layer: for example an amplifier and a photodiode are made in the active layer 14; or they are separated from each other by a thin layer 13, 22 of InP highly doped with n type carriers as described here above. In particular, the composition of the zone 12B, separated from the zone 12A by the thin intermediate layer 22 of InP with high n doping, may be different from that of the zone 12A.

Figure 6:
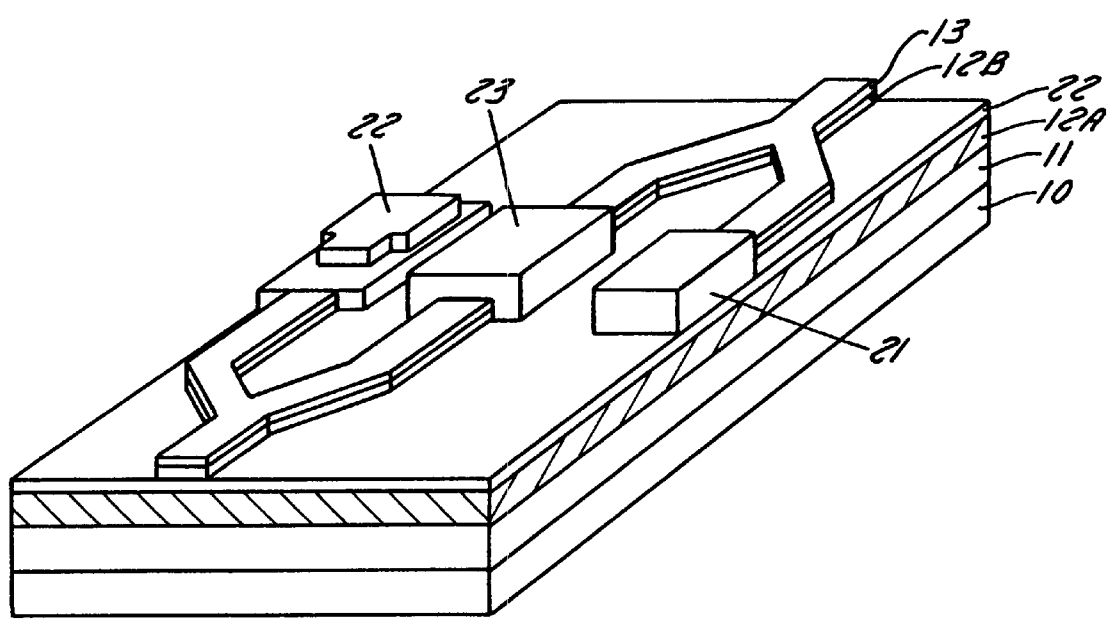
FIG. 6 shows a view in perspective of another device made according to a method of manufacture according to the invention.

An example of a particular integrated photonic device made according to the manufacturing method described here above is shown schematically in FIG. 6. This device is very valuable for optical switching. More particularly, it represents a point of access also called a switching point.

Like all the devices described here above, this point of access has a substrate 10, a buffer layer 11, a guiding layer 12, an intermediate layer 13 and an active layer. The active layer is etched in the form of strips which are buried in sheathing layers. The guiding layer 12 preferably has a first guiding zone 12A, another intermediate layer 22 and a second guiding layer 12B. The second guiding layer 12B is furthermore etched so as to provide for the charge of the guide and form two Y-shaped connections placed in a staggered arrangement. This point of access has three different optical functions which are made in the same layer. These optical functions made in the active layer are carried out respectively by a photodiode 22, a laser 21 and an amplifier 23.

Several access points similar to this one may thus be placed at any of the points of a network. The photodiode 22 then plays the role of a receiver and therefore enables the extraction, at any point of a network, of an optical signal. The amplifier 23 for its part plays the role of an optical gate and enables compensation for the optical losses, namely the regeneration of the optical signal from the network. Finally, the laser 21 plays the role of an emitter and enables the reinjection of an optical signal into the network.

What is claimed is:

1. A method for the manufacture of a buried structure device and for the integration of this device with an optical guide in a photonic circuit, the method comprising:

(A) growing, on a buffer layer doped with carriers of a first type, itself deposited on an entire surface of a substrate doped with carriers of the same type, a guiding layer formed by a non-doped quaternary compound, then (B) growing an extremely thin intermediate layer highly doped with carriers of the first type, then (C) growing an active layer formed by a non-doped quaternary compound, then (D) growing a protection layer doped with carriers of a second type, then (E) etching the active layer in the form of at least one strip and leaving the intermediate layer, the guiding layer, and the buffer layer substantially unetched, and then (F) growing a sheathing layer doped with carriers of the second type, the sheathing layer burying the at least one strip of the active layer.

2. A method according to claim 1, wherein the growth of the guiding layer is done on a thickness smaller than 1 μm and greater than 0.3 μm.

3. A method according to claim 1,
wherein the intemediate layer is a first intermediate layer and the guiding layer is a first guiding layer,
wherein the method further comprises
growing a second extremely thin intermediate layer highly doped with carriers of the first type on the first guiding layer, and
growing a second guiding layer formed by a non-doped quaternary compound, and
wherein the first intermediate layer and the second guiding layer are etched in the form of a strip located beneath the strip or strips of active layer in order to ensure sufficient lateral confinement of light in the first guiding layer.

4. A method according to claim 1, wherein the growth of the intermediate layer or layers is done on a thickness in the range of 0.01 to 0.1 μm.

5. A method according to claim 1, wherein the intermediate layer is doped with n type carriers in a concentration in the range of $2 \times 10^{17}$ to $2 \times 10^{18}$ cm$^{-3}$.

6. A method according to claim 1, wherein the intermediate layer is made of indium phosphide.

7. A method according to claim 1, wherein the growth of the active layer is done on a thickness of less than 0.6 μm.

8. A method according to claim 1, wherein the guiding layer and the active layer are made of quaternary material constituted by GaInAsp.

9. A method according to claim 1, wherein the growth of the intermediate, guiding and active layers is done in only one step by chemical vapor deposition.

10. A method according to claim 1, wherein the etching of the active layer is done by a method of dry and/or wet etching and wherein the strip or strips of etched active layer are oriented in the crystallographic direction {001}.

11. A method according to claim 1, wherein a resumption of epitaxy makes it possible to obtain the growth of the sheathing layer, made of indium phosphide, so as to bury the strip or strips of the active layer.

12. A method according to claim 1, wherein at least the sheathing layer, a conductive layer of InGaAs covering the sheathing layer and the intermediate layer are implanted in depth in protons, in two regions located on either side of a channel in which there flows the operating current.

13. A method according to claim 1, wherein a mode adaptor in the form of pointed features is made between two respective optical functions of the guiding layer and the active layer.

14. A method for the manufacture of a buried structure device, the method comprising;

(A) growing a guiding layer formed by a non-doped quaternary compound on a buffer layer doped with carriers of a first type, the buffer layer itself being deposited on an entire surface of a substrate doped with carriers of the same type, and the buffer layer having a rectangular cross section such that a top surface of the buffer layer and a bottom surface of the buffer layer are of equal width, then (B) growing an extremely thin intermediate layer, the intermediate layer being highly doped with carriers of the first type and covering an entire surface of the guiding layer so as to provide the guiding layer with a high confinement factor, the (C) growing an active layer formed by a non-doped quaternary compound, the strip of active layer forming at least one of a laser and an amplifier, then (D) growing a protection layer doped with carriers of a second type, then (E) etching the active layer in the form of at least one strip and leaving the intermediate layer, the guiding layer, and the buffer layer substantially unetched, and then (F) growing a sheathing layer doped with carriers of the second type, and the sheathing layer covering the at least one strip of the active layer, and wherein a width of the guiding layer, the width of the top and bottom surfaces of the buffer layer, and a width of the substrate are all equal.

15. A method according to claim 14, wherein the growing of the guiding layer is done on a thickness smaller than 1 μm and greater than 0.3 μm.

16. A method according to claim 14,
wherein the intermediate layer is a first intermediate layer and the guiding layer is a first guiding layer,
wherein the method further comprises
growing a second extremely thin intermediate layer highly doped with carriers of the first type on the first guiding layer, and
growing a second guiding layer formed by a non-doped quaternary compound, and
wherein the first intermediate layer and the second guiding layer are etched in the form of a strip located beneath the strip or strips of active layer in order to ensure sufficient lateral confinement of light in the first guiding layer.

17. A method according to claim 14, wherein the growth of the intermediate layer or layers is done on a thickness in the range of 0.01 to 0.1 μm.

18. A method according to claim 14, wherein the intermediate layer is doped with n type carriers in a concentration in the range of $2 \times 10^{17}$ to $2 \times 10^{18}$ cm$^{31}$.

19. A method according to claim 14, wherein at least the sheathing layer, a conductive layer of InGaAs covering the sheathing layer and the intermediate layer are implanted in depth in protons, in two regions located on either side of a channel in which there flows the operating current.

20. A method according to claim 14, wherein a mode adaptor in the form of pointed features is made between two respective optical functions of the guiding layer and the active layer.

* * * * *